(12) United States Patent
Geffken et al.

(10) Patent No.: US 7,759,251 B2
(45) Date of Patent: Jul. 20, 2010

(54) DUAL DAMASCENE INTEGRATION STRUCTURE AND METHOD FOR FORMING IMPROVED DUAL DAMASCENE INTEGRATION STRUCTURE

(75) Inventors: Robert M. Geffken, Burlington, VT (US); John J. Hautala, Beverly, MA (US)

(73) Assignee: Tel Epion Corporation, Billerica, MA (US)

( * ) Notice: Subject to any disclaimer, the term of this patent is extended or adjusted under 35 U.S.C. 154(b) by 323 days.

(21) Appl. No.: 11/143,421

(22) Filed: Jun. 2, 2005

(65) Prior Publication Data
US 2005/0272265 A1    Dec. 8, 2005

Related U.S. Application Data

(60) Provisional application No. 60/576,439, filed on Jun. 3, 2004.

(51) Int. Cl.
*H01L 21/302* (2006.01)

(52) U.S. Cl. ............... 438/700; 438/706; 438/712; 438/736; 438/740

(58) Field of Classification Search ........... 438/700, 438/703, 706, 710, 712, 736, 740
See application file for complete search history.

(56) References Cited

U.S. PATENT DOCUMENTS

| | | | | |
|---|---|---|---|---|
| 4,423,547 | A | 1/1984 | Farrar et al. | 29/571 |
| 5,525,158 | A * | 6/1996 | Tsukazaki et al. | 118/723 CB |
| 5,795,819 | A | 8/1998 | Motsiff et al. | 438/618 |
| 5,814,194 | A | 9/1998 | Deguchi et al. | 204/192 |
| 5,985,762 | A | 11/1999 | Geffken et al. | 438/687 |
| 6,150,723 | A | 11/2000 | Harper et al. | 257/762 |
| 6,300,236 | B1 | 10/2001 | Harper et al. | 438/618 |
| 6,331,227 | B1 * | 12/2001 | Dykstra et al. | 156/345.29 |
| 6,426,249 | B1 | 7/2002 | Geffken et al. | 438/239 |

(Continued)

FOREIGN PATENT DOCUMENTS

JP    07014504    *    1/1995

(Continued)

OTHER PUBLICATIONS

Standaert et al., High-density plasma patterning of low dielectric constant polymers: A comparison between polytetrafluoroethylene, parylene-N, and poly(arylene ether), J. Vac Sci. Technol. A 19(2), Mar./Apr. 2001, pp. 435-446.*

(Continued)

*Primary Examiner*—Binh X Tran
(74) *Attorney, Agent, or Firm*—Burns & Levinson LLP; Jerry Cohen; David W. Gomes

(57) ABSTRACT

Methods for forming a dual damascene dielectric structure in a porous ultra-low-k (ULK) dielectric material by using gas-cluster ion-beam processing are disclosed. These methods minimize hard-mask layers during dual damascene ULK processing and eliminate hard-masks in the final ULK dual damascene structure. Methods for gas-cluster ion-beam etching, densification, pore sealing and ashing are described that allow simultaneous removal of material and densification of the ULK interfaces. A novel ULK dual damascene structure is disclosed with densified interfaces and no hard-masks.

37 Claims, 16 Drawing Sheets

U.S. PATENT DOCUMENTS

| | | | |
|---|---|---|---|
| 6,426,304 B1* | 7/2002 | Chien et al. | 438/727 |
| 6,426,558 B1 | 7/2002 | Chapple-Sokol et al. | 257/758 |
| 6,452,251 B1 | 9/2002 | Bernstein et al. | 257/532 |
| 6,486,478 B1* | 11/2002 | Libby et al. | 250/492.1 |
| 6,503,827 B1 | 1/2003 | Bombardier et al. | 438/631 |
| 6,812,147 B2* | 11/2004 | Skinner et al. | 438/690 |
| 6,863,786 B2* | 3/2005 | Blinn et al. | 204/192.34 |
| 7,071,126 B2 | 7/2006 | Johnston et al. | |
| 2002/0031906 A1* | 3/2002 | Jiang et al. | 438/622 |
| 2004/0000721 A1 | 1/2004 | Cooney, III et al. | 257/774 |
| 2004/0018714 A1 | 1/2004 | Cooney, III et al. | 438/618 |
| 2004/0069410 A1* | 4/2004 | Moghadam et al. | 156/345.32 |
| 2004/0137733 A1 | 7/2004 | Hautala | 438/689 |
| 2004/0160700 A1* | 8/2004 | Kagami et al. | 360/244 |
| 2004/0229452 A1* | 11/2004 | Johnston et al. | 438/622 |
| 2005/0042800 A1* | 2/2005 | Yamada et al. | 438/105 |
| 2005/0184397 A1* | 8/2005 | Gates et al. | 257/774 |
| 2005/0239278 A1* | 10/2005 | Li et al. | 438/618 |

FOREIGN PATENT DOCUMENTS

WO    WO2004/053945    6/2004

OTHER PUBLICATIONS

Shigeo et al., Manfacture of Field Emitting Element, Jan. 17, 1995, English Abstract and Computer translation of JP 7014504 into English, 8 pages.*

Brown, Walter, L. and Sosnowski, Marek, Cluster-solid interaction experiments, Nucl. Instr. and Meth. in Phys. Res. B 102 (1995) 305-311.

Henkes, P.R.W. and Krevnet, B, Structuring of various materials using cluster ions, J. Vac. Sci. Technol. A 13(4), Jul./Aug. 1995, 2133-2137.

* cited by examiner

400 A

400 B

400C

400D

400E

400F

600E

600F

US 7,759,251 B2

DUAL DAMASCENE INTEGRATION STRUCTURE AND METHOD FOR FORMING IMPROVED DUAL DAMASCENE INTEGRATION STRUCTURE

CROSS-REFERENCE TO RELATED APPLICATIONS

This application claims the benefit of priority to, and incorporates herein by reference, U.S. provisional patent application Ser. No. 60/576,439, filed Jun. 3, 2004, and entitled "Improved Dual Damascene Integration Structure and Method for Forming Improved Dual Damascene Integration Structure."

FIELD OF THE INVENTION

This invention relates generally to improved dual damascene integration structures for semiconductor integrated circuits utilizing low dielectric constant (low-k) dielectrics, and to methods of forming such structures using low-k dielectrics and the application of gas-cluster ion-beam processing.

BACKGROUND OF THE INVENTION

The semiconductor industry has had tremendous success in delivering ever more cost effective chips to market through the use of scaling. However, while scaling works well in device or front end of semiconductor processing, device wiring is not amenable to scaling and results in degraded interconnect resistance and/or capacitance. To alleviate this problem, the industry has been migrating to the use of a lower resistance conductor (copper) and is also introducing lower-k insulators to reduce capacitance. Newly developed insulators in the ultra-low-k (ULK) range (k<2.5) are generally characterized by a great deal of porosity (e.g., 30-50%.) These materials are extremely difficult to integrate since they are susceptible to contamination from other wet chemicals and gases.

Conventional dual damascene ULK integration schemes rely on a series of higher-k hard-mask films to protect the surface of the porous and fragile ULK films. The two most widely used process sequences are the "via first" scheme and the conventional "dual hard-mask".

FIGS. 2A-2F show schematics illustrating in-process structures (identified as 300A-300F) resulting after each step in a conventional "via first" dual damascene ULK integration process. The "via first" process begins with deposition of a sequence of insulator films over the previous metal wiring level (not shown in the figures.) As shown in FIG. 2A, this insulator stack 300A is comprised of etch stop film 302, ULK dielectric layer 304, first hard-mask layer 306, second hard-mask layer 308, antireflective coating 310, and photoresist layer 312. The etch stop film 302 must have a reasonably low-k value and the ULK dielectric layer 304 must have a high etch rate ratio with respect to the etch stop film 302. If the prior (underlying) metal wiring layer is copper, then this etch stop film 302 must also be a Cu diffusion barrier. The most commonly used etch stop films for this application are $Si_3N_4$ and SiCN.

The first hard-mask layer 306 is intended to remain as part of the dual damascene structure after processing to protect the fragile, porous ULK dielectric layer 304 from the effects of a subsequent chemical mechanical polishing (CMP) step. The second hard-mask layer 308 is a material that provides oxidation resistance and enables photo rework through ash removal of the antireflective coating 310 and the photoresist layer 312. Typical materials used for first hard-mask layer 306 are SiCOH or SiC while $SiO_2$ and $Si_3N_4$ are typically used for second hard-mask layer 308. The second hard-mask layer 308 is a sacrificial layer and is removed during subsequent CMP of the Cu and barrier materials.

As reflected by structure 300B of FIG. 2B, the photoresist layer 312 is then imaged in the desired via pattern and then reactive ion etching (RIE) is used to transfer the pattern down through the antireflective coating 310, hard-mask layers 306 and 308 and through the ULK dielectric layer 304 while stopping on the SiCN etch stop, thus forming via 324. As depicted in FIG. 2C, any remaining photoresist layer 312 and antireflective coating 310 are removed by plasma ashing with mixtures of oxygen and other gases to obtain structure 300C. Another prior art alternative is plasma ashing of the resist followed by solvent removal of the antireflective coating layers. RIE polymer on the via sidewalls 314 is traditionally removed by wet cleans. It has been shown that both the oxygen plasma ashing and wet clean processes, which were traditionally used with $SiO_2$ dielectrics, can damage the porous ULK dielectric layer 304 materials and so are not optimal because they are detrimental to the process and can reduce the reliability and performance of the circuits thus formed.

As shown in FIG. 2D, antireflective coating and photoresist materials are next re-applied to the patterned wafer to obtain structure 300D. A bottom antireflective coating 316, which will fill the etched vias (via 324, for example) and planarize the surface is applied first. A third hard-mask layer 318 is then applied, which will allow photo rework, and this is followed by a standard antireflective coating 320 and photoresist layer 322. One prior art alternative to this scheme is to completely remove and then re-apply all anti-reflective coating and photoresist layers during each photo rework operation.

FIG. 2E shows the stack (structure 300E) after imaging the photoresist layer 322 in a desired trench pattern and after transferring through RIE the pattern down through the third hard-mask layer 318, bottom antireflective coating 316, second hard-mask layer 308, first hard-mask layer 306 and partially into the ULK dielectric layer 304, thus forming a trench 326. It should be noted that the bottom antireflective coating 316 material should have a slightly faster RIE etch rate than the ULK dielectric layer 304 material or un-etched protrusions "fences" will remain around the via periphery.

Now referring to FIG. 2F, RIE is used to remove any remaining photoresist layer 322, antireflective coating 320, third hard-mask layer 318, bottom antireflective layer 316, and to open the underlying etch stop film 302, thus completing via 324 and obtaining structure 300F. It should again be noted that oxygen RIE processes and any needed wet cleans have been shown to permeate and degrade the porous ULK dielectric layer 304 material, to the detriment of the process and to the reduced reliability and performance of the circuits thus formed.

FIGS. 3A-3G show schematics illustrating in-process structures 400A-400G corresponding to stages in the prior art conventional "dual hard-mask" dual damascene ULK integration scheme, a second widely used formation process.

As shown in FIG. 3A, the "dual hard-mask" process begins with deposition of a sequence of insulator films over the previous metal wiring level. Similar to the "via first" scheme discussed above, this "dual hard-mask" insulator stack (structure 400A) is also comprised of an etch stop film 402, a ULK dielectric layer 404, a first hard-mask layer 406, second hard-mask layer 408, an antireflective coating 410, and a photoresist layer 412. The first hard-mask layer 406 in this integration scheme is intended to remain as part of the dual damascene structure after processing to protect the fragile, porous ULK dielectric layer 404 from the effects of subsequent CMP. A RIE etching chemistry for which the second hard-mask layer 408 has a high etch rate with respect to that for the first hard-mask layer 406 must be used initially and subsequently other chemistries must be applied for which the second hard-mask layer 408 has a low etch rate with respect to the ULK dielectric layer 404. The second hard-mask layer 408 is a sacrificial layer and is removed during CMP of the Cu and barrier materials.

As shown in FIG. 3B, the photoresist layer 412 is then imaged in the desired trench pattern and RIE is used to transfer the pattern down through the antireflective coating 410 and second hard-mask layer 408, stopping at first hard-mask layer 406, thus forming trench pattern 414 in the second hard-mask layer 408 in structure 400B.

As reflected in structure 400C depicted in FIG. 3C, the remaining photoresist layer 412 and antireflective coating 410 are either removed by plasma ashing with mixtures of oxygen and other gases or alternatively by using wet solvents.

As shown in FIG. 3D, antireflective coating 416 and photoresist layer 418 are next re-applied to the patterned wafer to obtain structure 400D.

FIG. 3E shows resultant structure 400E following imaging of the photoresist layer 418 in the desired via pattern followed by RIE transfer of the pattern down through the antireflective coating 416, second hard-mask layer 408, first hard-mask layer 406, and partially into the ULK dielectric layer 404, forming partial via 420. It should be noted that the antireflective coating 416 material should have a similar etch rate to the second hard-mask layer 408 during this process.

As shown in FIG. 3F, an ashing or RIE process is then used to remove any remaining photoresist layer 418 and antireflective coating 416 from the workpiece to obtain structure 400F.

The structure 400G illustrated in FIG. 3G shows that next a RIE process is used to extend the second hard-mask layer's trench pattern 414 through first hard-mask layer 406 and into the ULK dielectric layer 404, forming trench 424, while simultaneously completing the via etch and thus opening up the underlying etch stop film at the bottom of the completed via 422. The second hard-mask layer 408 is partially consumed during this process and is intended to be completely removed during the subsequent barrier and Cu CMP process. It should also be noted that since a portion of the via 422 is not protected by resist or a hard-mask during this RIE process, the via shape tends to become elongated and to develop a sloped region 426 as also shown in FIG. 3G. A subsequent argon pre-clean process for the Cu barrier and seed layer tends to sputter material from this sloped region 426 into the bottom of the via 422, which is typically a copper metal layer, and causes contamination and reliability problems.

A problem common to both of these prior art integration schemes ("via first" and "dual hard-mask" is that RIE is subject to micro-loading effects that lead to poor control of trench depth and shape and, therefore, poor control of the wiring resistance and capacitance. The inability to definitively specify wiring resistance and capacitance to the design community has a negative impact on chip performance.

Since RIE leaves the etched ULK dielectric surfaces as an open porous structure, these interfaces are not compatible with the desire to use ALD or CVD techniques for the subsequent barrier and seed layer processes.

In addition, both of these prior art integration schemes utilize multiple hard-masks for processing which are complex and costly. The final insulator dual damascene structure also retains a hard-mask layer which raises the effective k value of the insulator structure and also serves as a focal point for leakage, delamination, and other potential reliability problems.

There are a number of problems shared by both of these integration schemes. First, the resulting final structures produced by these processes retain one or more of the hard-mask layers. This raises the effective k value of the insulator structure and is not desirable. There is additional motivation to minimize the use of these hard-mask layers in that every additional material interface is a potential source for electrical leakage, delamination, or other reliability problems. Also, the etched surfaces of the trench and via structure are open to contamination from subsequent process steps. For example conventional wet or dry stripping processes have been shown to contaminate the ULK films. In addition, it is desirable to use chemical vapor deposition (CVD) or atomic layer deposition (ALD) processes to deposit the barrier film in subsequent processing steps. It has been shown that ALD and CVD processes penetrate the porous RIE etched sidewalls and raise the k value of the ULK films. Finally, conventional RIE is subject to seasoning and micro-loading effects that lead to a great deal of variability in the shape and depth of the trench and, therefore, the wiring resistance and capacitance. This inability to definitively specify wiring resistance and capacitance to the semiconductor design community has a negative impact on chip performance.

SUMMARY OF THE INVENTION

The present invention uses gas-cluster ion-beam (GCIB) processing and novel integration structures to solve many of the problems described above.

The use of cluster ion beams for processing surfaces is known in the art (see for example, U.S. Pat. No. 5,814,194, Deguchi et al., incorporated herein by reference.) For purposes of this discussion, gas-clusters are nano-sized aggregates of materials that are gaseous under conditions of standard temperature and pressure. Such gas-clusters typically are comprised of aggregates of from a few to several thousand molecules loosely bound to form the cluster. The clusters can be ionized by electron bombardment or other means, permitting them to be formed into directed beams of controllable energy. Such ions each typically carry positive charges of $q \cdot e$ (where e is the electronic charge and q is an integer of from one to several representing the charge state of the cluster ion). Non-ionized clusters may also exist within a cluster ion beam. The larger sized cluster ions are often the most useful because of their ability to carry substantial energy per cluster ion, while yet having only modest average energy per molecule of from a fraction of an electron volt to a few tens of electron volts. The clusters disintegrate on impact, with each individual molecule carrying only a small fraction of the total cluster ion energy. Consequently, the impact effects of large cluster ions are substantial, but are limited to a very shallow surface region. This makes cluster ions effective for a variety of surface modification processes, without the tendency to produce deeper subsurface damage characteristic of conventional monomer ion beam processing.

Apparatus for creation of and acceleration of such GCIBs are described in the reference (U.S. Pat. No. 5,814,194) previously cited. Presently available cluster ion sources produce clusters ions having a wide distribution of sizes, N, up to 5000 or more (where N=the number of molecules in each cluster ion—in the case of monatomic gases like argon, an atom of the monatomic gas will be referred to herein as a molecule and an ionized atom of such a monatomic gas will be referred to as a molecular ion—or simply a monomer ion.) Many useful surface processing effects can be achieved by bombarding surfaces with GCIBs. These processing effects include, but are not necessarily limited to, cleaning, smoothing, etching, doping, and film formation or growth.

It is an objective of this invention to provide methods of GCIB processing of low-k dielectric materials to form dual damascene integration structures that minimize the requirement to use hard-masks.

It is another objective of this invention to provide methods of GCIB processing of low-k dielectric materials to form dual damascene integration structures that include no hard-masks in the final etched structure.

It is a further objective of this invention to provide methods of densifying and sealing all etched surfaces to reduce their susceptibility to contamination from subsequent processes.

It is a still further objective of this invention to provide better control over etched trench depths and shapes and resultant interconnection resistance and capacitance.

It is still another objective of this invention to provide improved articles in the form of ULK integration structures with a reduced number, or even no hard-mask uses in the dual damascene formation process and fewer to no hard-masks in the final etched structures.

BRIEF DESCRIPTION OF THE FIGURES

For a better understanding of the present invention, together with other and further objects thereof, reference is made to the accompanying drawings and detailed description, wherein.

DETAILED DESCRIPTION OF CERTAIN PREFERRED EMBODIMENTS OF THE INVENTION

Figure 1:
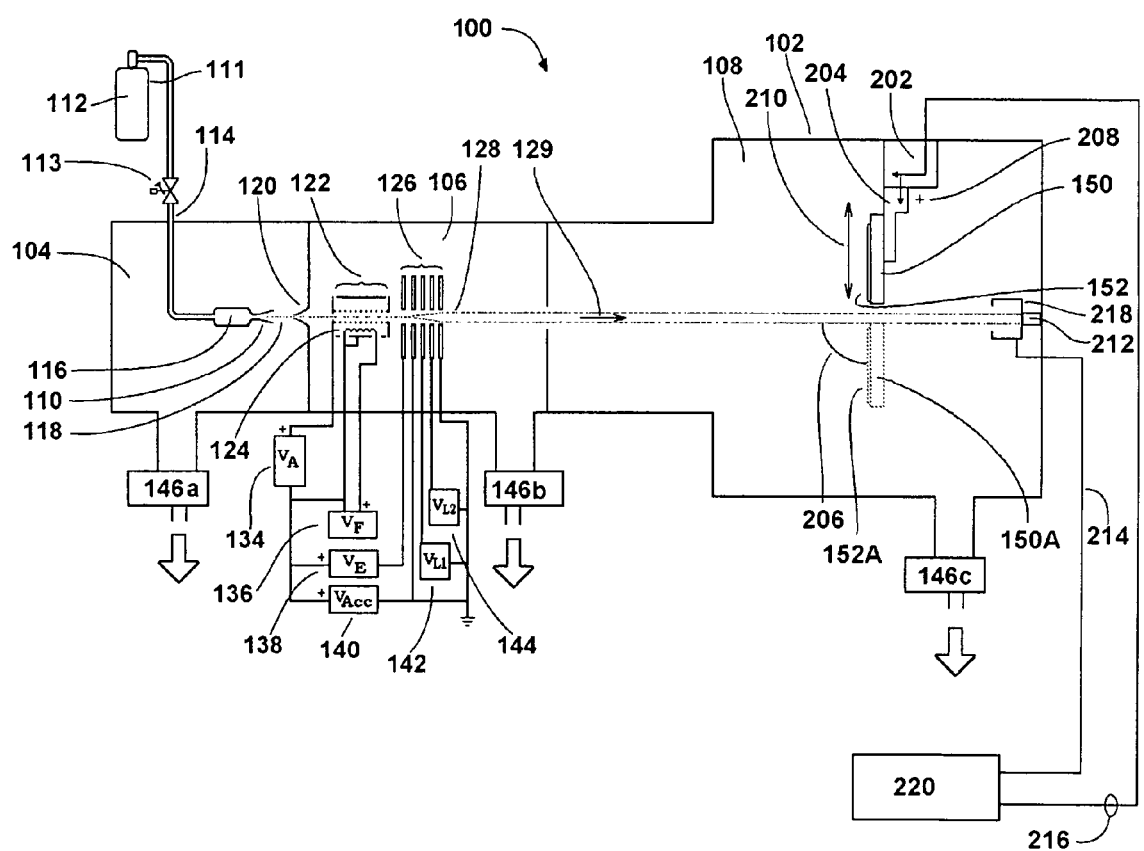
FIG. 1 is a schematic showing the basic elements of a prior art GCIB processing apparatus.

FIG. 1 shows a schematic of the basic elements of a typical configuration for a GCIB processing apparatus 100 which may be described as follows: a vacuum vessel 102 is divided into three communicating chambers, a source chamber 104, an ionization/acceleration chamber 106, and a processing chamber 108. The three chambers are evacuated to suitable operating pressures by vacuum pumping systems 146a, 146b, and 146c, respectively. A condensable source gas 112 (for example argon or $N_2$) stored in a gas storage cylinder 111 is admitted under pressure through gas metering valve 113 and gas feed tube 114 into stagnation chamber 116 and is ejected into the substantially lower pressure vacuum through a properly shaped nozzle 110. A supersonic gas jet 118 results. Cooling, which results from the expansion in the jet, causes a portion of the gas jet 118 to condense into clusters, each comprising from several to several thousand weakly bound atoms or molecules. A gas skimmer aperture 120 partially separates the gas molecules that have not condensed into a cluster jet from the cluster jet so as to minimize pressure in the downstream regions where such higher pressures would be detrimental (e.g., ionizer 122, high voltage electrodes 126, and processing chamber 108). Suitable condensable source gases 112 include, but are not necessarily limited to argon, nitrogen, carbon dioxide, oxygen, and other gases and mixtures thereof.

After the supersonic gas jet 118 containing gas-clusters has been formed, the clusters are ionized in an ionizer 122. The ionizer 122 is typically an electron impact ionizer that produces thermoelectrons from one or more incandescent filaments 124 and accelerates and directs the electrons causing them to collide with the gas-clusters in the gas jet 118, where the jet passes through the ionizer 122. The electron impact ejects electrons from the clusters, causing a portion the clusters to become positively ionized. Some clusters may have more than one electron ejected and may become multiply ionized. A set of suitably biased high voltage electrodes 126 extracts the cluster ions from the ionizer, forming a beam, and then accelerates them to a desired energy (typically with acceleration potentials of from several hundred V to several tens of kV) and focuses them to form a GCIB 128. Filament power supply 136 provides filament voltage $V_f$ to heat the ionizer filament 124. Anode power supply 134 provides anode voltage $V_A$ to accelerate thermoelectrons emitted from filament 124 to cause them to irradiate the cluster containing gas jet 118 to produce ions. Extraction power supply 138 provides extraction voltage $V_E$ to bias a high voltage electrode to extract ions from the ionizing region of ionizer 122 and to form a GCIB 128. Accelerator power supply 140 provides acceleration voltage $V_{Acc}$ to bias a high voltage electrode with respect to the ionizer 122 so as to result in a total GCIB acceleration potential equal to $V_{Acc}$. One or more lens power supplies (142 and 144 shown for example) may be provided to bias high voltage electrodes with focusing voltages ($V_{L1}$ and $V_{L2}$ for example) to focus the GCIB 128.

A workpiece 152, which may be a semiconductor wafer or other workpiece to be processed by GCIB processing, is held on a workpiece holder 150, which can be disposed in the path of the GCIB 128. Since most applications contemplate the processing of large workpieces with spatially uniform results, a scanning system is desirable to uniformly scan the GCIB 128 across large areas to produce spatially homogeneous results.

The GCIB 128 is stationary, has a GCIB axis 129, and the workpiece 152 is mechanically scanned through the GCIB 128 to distribute the effects of the GCIB 128 over a surface of the workpiece 152.

An X-scan actuator 202 provides linear motion of the workpiece holder 150 in the direction of X-scan motion 208 (into and out of the plane of the paper). A Y-scan actuator 204 provides linear motion of the workpiece holder 150 in the direction of Y-scan motion 210, which is typically orthogonal to the X-scan motion 208. The combination of X-scanning and Y-scanning motions moves the workpiece 152, held by the workpiece holder 150 in a raster-like scanning motion through GCIB 128 to cause a uniform (or otherwise programmed) irradiation of a surface of the workpiece 152 by the GCIB 128 for processing of the workpiece 152. The workpiece holder 150 disposes the workpiece 152 at an angle with respect to the axis of the GCIB 128 so that the GCIB 128 has an angle of beam incidence 206 with respect to the workpiece 152 surface. The angle of beam incidence 206 may be any suitable angle, but is typically 90 degrees or near 90 degrees. During Y-scanning, the workpiece 152 and the workpiece holder 150 move from the position shown to the alternate position "A" indicated by the designators 152A and 150A respectively. Notice that in moving between the two positions, the workpiece 152 is scanned through the GCIB 128 and in both extreme positions, is moved completely out of the path of the GCIB 128 (over-scanned). Though not shown explicitly in FIG. 1, similar scanning and over-scan is performed in the (typically) orthogonal X-scan motion 208 direction (in and out of the plane of the paper).

A beam current sensor 218 is disposed beyond the workpiece holder 150 in the path of the GCIB 128 so as to intercept a sample of the GCIB 128 when the workpiece holder 150 is scanned out of the path of the GCIB 128. The beam current sensor 218 is typically a faraday cup or the like, closed except for a beam-entry opening, and is typically affixed to the wall of the vacuum vessel 102 with an electrically insulating mount 212.

A controller 220, which may be a microcomputer based controller connects to the X-scan actuator 202 and the Y-scan actuator 204 through electrical cable 216 and controls the X-scan actuator 202 and the Y-scan actuator 204 so as to place the workpiece 152 into or out of the GCIB 128 and to scan the workpiece 152 uniformly relative to the GCIB 128 to achieve desired processing of the workpiece 152 by the GCIB 128. Controller 220 receives the sampled beam current collected by the beam current sensor 218 by way of lead 214 and thereby monitors the GCIB and controls the GCIB dose received by the workpiece 152 by removing the workpiece 152 from the GCIB 128 when a predetermined desired dose has been delivered.

For use in the present invention, the inventors have developed GCIB processes useful at several stages of semiconductor integration. These include processes for etching, for ashing photoresists and the like, and for densifying and pore sealing of porous ULK dielectrics.

TABLE 1

GCIB Processing Parameters for Etching Processes (all Values are Approximations)

| Some Useful Gasses | Typical Gas | Range of Gas Flow (SCCM) | Typical Gas Flow (SCCM) | $V_{ACC}$ Range (kV) | Typical $V_{ACC}$ (kV) |
|---|---|---|---|---|---|
| $O_2$ and Fluorine-containing gases such as $CF_4$, $CHF_3$, $C_2F_2$, $SF_6$, $NF_3$, and Mixtures of fluorine-containing gases with $O_2$, for example 1-10% $NF_3$ in 90-99% $O_2$ | 5% $NF_3$ in 95% $O_2$ | 200-2000 | 500 | 10-80 | 30 |

Although several useful gasses and gas mixtures are listed in Table 1, many other gasses and mixtures are also useful in different etching situations, and practice of the invention is not necessarily limited to use of the preferred gasses and conditions specified in Table 1. Optimal gas flow is dependent on the characteristics of the GCIB processing system. The gas flow values listed in Table 1 are optimized for use in either the commercially available nFusion™ model GCIB 200 processing system, or the nFusion™ model GCIB 300 processing system, both manufactured and offered commercially by Epion Corporation (Billerica, Mass.) The GCIB dose required for etching is determined by the material and thickness etched, but typical doses are on the order of $1 \times 10^{15}$ ions/cm$_2$. It should be noted that often it is desirable to etch two or more materials simultaneously and to have a controllable ratio of etch rate for each of the materials. In such cases, mixtures of gases are particularly useful and by controlling the ratio of gases in the mixture, the differential etch rates for different materials can be controlled. As an example, the 1-10% $NF_3$ in 90-99% $O_2$ gas mixture suggested in Table 1, is useful for controlling differential etch rates by varying the gas mixture.

TABLE 2

GCIB Processing Parameters for Ashing Processes (all Values are Approximations)

| Some Useful Gasses | Typical Gas | Range of Gas Flow (SCCM) | Typical Gas Flow (SCCM) | $V_{ACC}$ Range (kV) | Typical $V_{ACC}$ (kV) |
|---|---|---|---|---|---|
| $O_2$, $N_2$, He, $H_2$, Ar, and mixtures of these gases | $N_2$ | 200-2000 | 700 | 10-80 | 30 |

Although several useful gasses/mixtures are listed in Table 2, many other gasses and mixtures are also useful in different ashing situations, and practice of the invention is not necessarily limited to use of the preferred gasses and conditions specified in Table 2. Optimal gas flow is dependent on the characteristics of the GCIB processing system. The gas flow values listed in Table 2 are similarly optimized for use in either the commercially available nFusion™ model GCIB200 processing system, or the nFusion™ model GCIB300 processing system. The GCIB dose required for ashing is determined by the material and thickness etched, but typical doses are on the order of $1 \times 10^{15}$ ions/cm$_2$.

TABLE 3

GCIB Processing Parameters for ULK Dielectric Surface Densification & Pore Sealing Processes (all Values are Approximations)

| Some Useful Gasses | Typical Gas | Range of Gas Flow (SCCM) | Typical Gas Flow (SCCM) | $V_{ACC}$ Range (kV) | Typical $V_{ACC}$ (kV) |
|---|---|---|---|---|---|
| $O_2$, Ar, $N_2$, $CH_4$ and mixtures of $CH_4$ with Ar | $N_2$ | 200-2000 | 700 | 2.5-20 for Ar and Ar mixtures 2.5-80 for $O_2$, $N_2$ | 15 30 |

Although several useful gasses/mixtures are listed in Table 3, many other gasses and mixtures are also useful in different ULK dielectric surface densification and pore sealing situations, and practice of the invention is not necessarily limited to use of the preferred gasses and conditions specified in Table 3. Optimal gas flow is dependent on the characteristics of the GCIB processing system. The gas flow values listed in Table 3 are similarly optimized for use in either the nFusion™ model GCIB200 model GCIB300 processing systems. The GCIB dose required for ULK dielectric surface densification and/or pore sealing is dependent on the material, but typical optimized doses are on the order of $1 \times 10^{14}$ to $5 \times 10^{14}$ ions/cm$_2$. Doses higher than $5 \times 10^{14}$ ions/cm$^2$ may be used, but saturation may occur and additional improvement is seldom achieved with higher doses. By controlling GCIB conditions ($V_{ACC}$, dose, gas, etc.—see Table 3) and depending on the ULK material employed, experimentally observed densified layer thicknesses range from less than about 50 Angstroms to more than about 350 Angstroms.

Figure 4A:
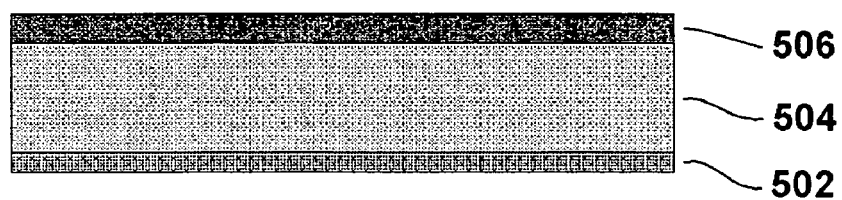
FIGS. 4A-4H show schematics illustrating an integration structure for a first embodiment of the invention and for explaining a first method of the invention.
Figure 4B:
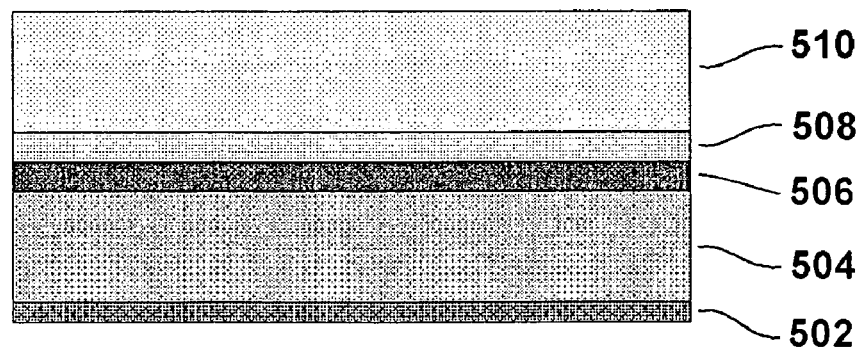
Figure 4C:
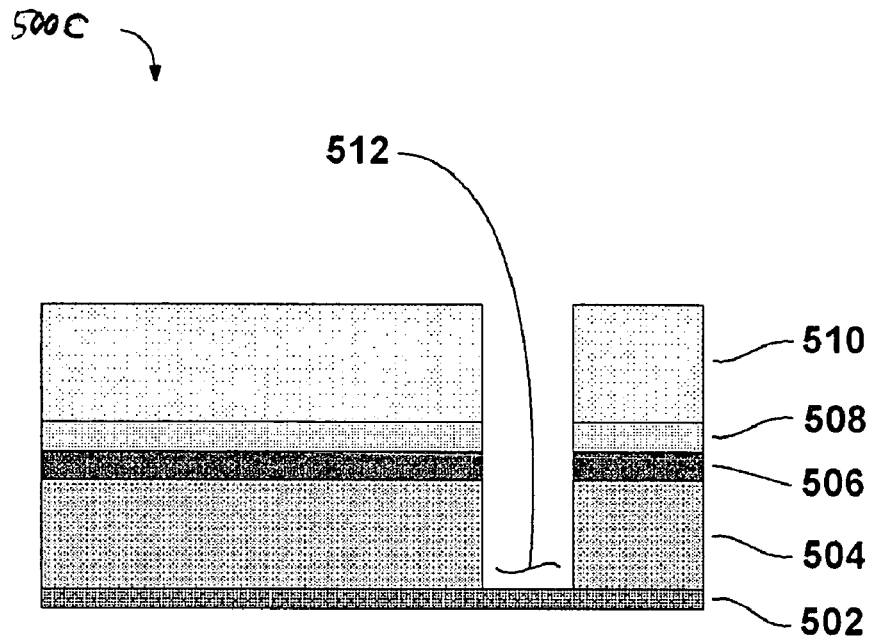
Figure 4D:
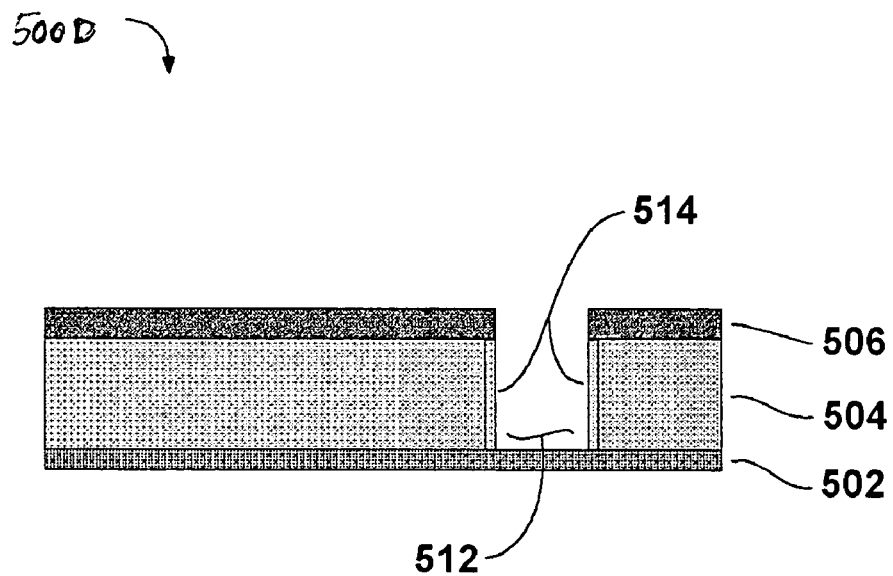
Figure 4E:
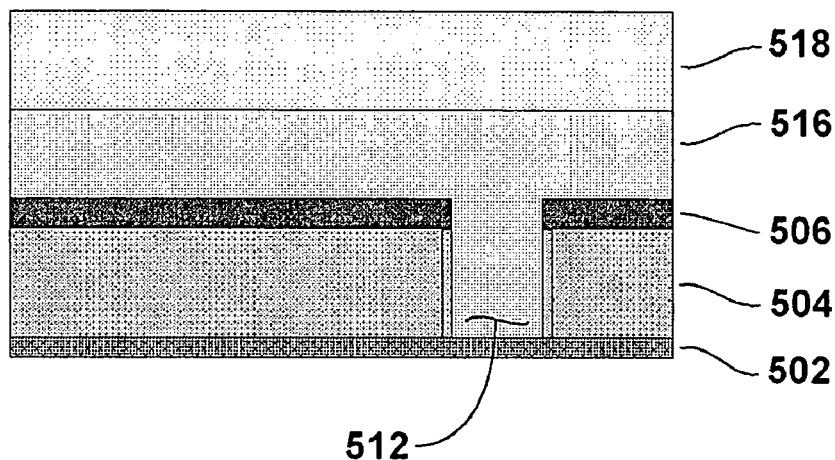
Figure 4F:
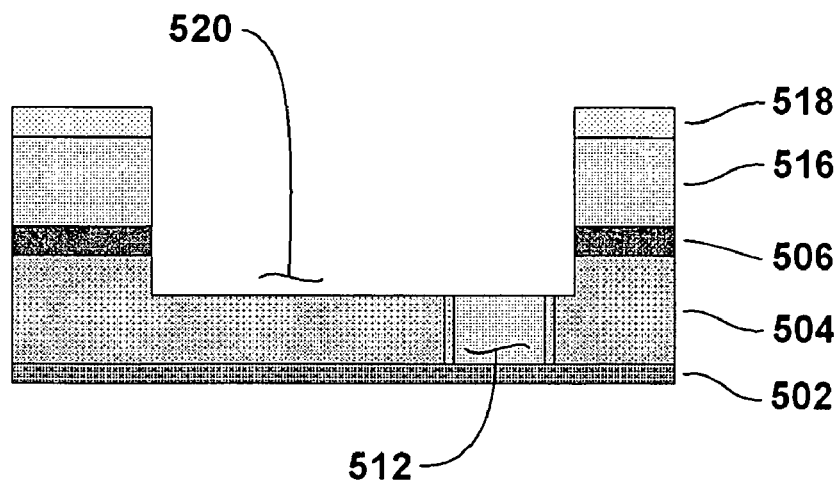
Figure 4G:
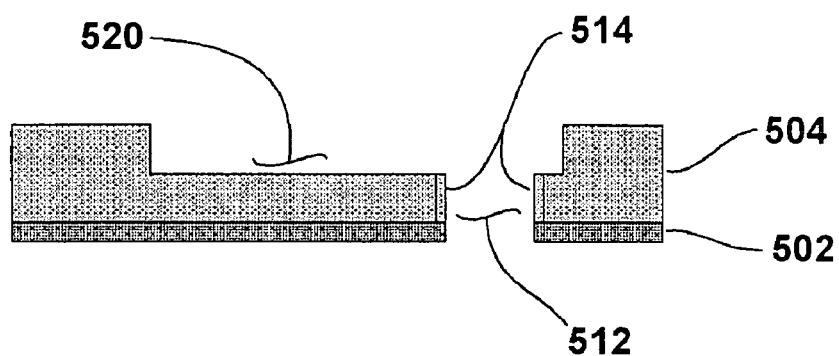
Figure 4H:
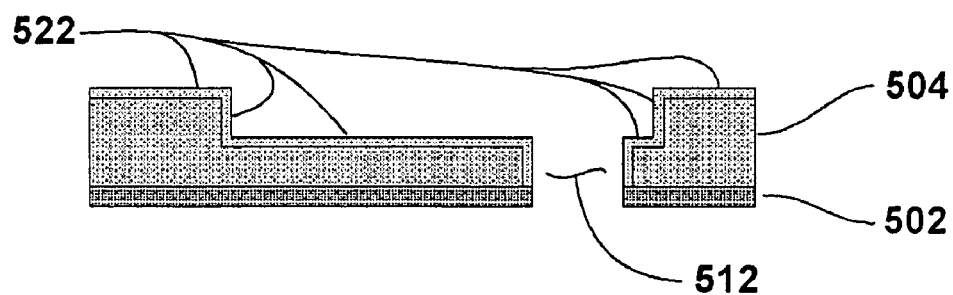

FIGS. 4A-4G illustrate in-process integration structures 500A-500G resulting from inventive process steps in a first embodiment of the present invention, a method for fabricating the dual damascene integration structure 500H shown in FIG. 4H incorporating porous ULK dielectrics. None of the suggested dimensions in any of the following embodiments are intended to limit the invention in any manner to such embodiments.

Referring to FIG. 4A, a process in accordance with the first embodiment of the invention begins with deposition of a sequence of insulator films over the previous metal wiring level (not shown, but would appear below the stop film layer 502 in structure 500A.) The insulator stack is comprised of an etch stop film 502, porous ULK dielectric layer 504 and a hard-mask layer 506. The etch stop material has the same requirements as previously stated for the prior art processes and therefore is typically composed of a material such as $Si_3N_4$ or SiCN. The etch stop film 502 may have a thickness of about 35 nm. The porous ULK dielectric layer 504 may have a thickness (for example) of about 300 nm.

The hard-mask layer 506 in this integration scheme does not remain as part of the dual damascene structure after processing. Therefore, relatively higher-k materials such as $SiO_2$ or $Si_3N_4$ may be used for hard-mask layer 506 compared to what would be required in a conventional integration scheme. Since $SiO_2$ or $Si_3N_4$ are also oxidation resistant, photo rework is allowed. The hard-mask layer 506 may have a thickness (for example) of about 40 nm.

In addition to $SiO_2$ and $Si_3N_4$, other suitable hard mask materials include, but are not necessarily limited to SiCOH, SiCN and SiC. Prior to formation of the hard-mask layer 506, the surface of the porous ULK dielectric layer 504 may be densified and pore-sealed by GCIB processing (see Table 3 for typical process parameters.)

As is illustrated in FIG. 4B, an antireflective coating 508 and a photoresist layer 510 of types known in the art are applied to insulator stack 500B. In most applications, the antireflective coating 508 and photoresist layer 510 will both be employed, but there may be applications wherein antireflective coating is not necessary. The antireflective coating 508 and photoresist layer 510 are collectively referred to herein as a "masking material" layer, however the same term could be applied, in such embodiments, to refer to a photoresist-only layer. The antireflective coating 508 may be (for exemplary purposes) about 40 nm thick and the photoresist layer 510 may be (for example) about 200 nm thick, measured from the upper surface of coating 508. The antireflective coating 508 may comprise (for example, not for limitation) "AR 40 Anti-Reflectant" and the photoresist layer 510 may comprise (for example, not for limitation) "Epic™ 2210 ArF Photoresist", both materials supplied commercially by Rohm and Haas Electronic Materials (Phoenix, Ariz.)

As shown in FIG. 4C, the resist is then imaged in the desired via pattern and then RIE or preferably GCIB etching (See Table 1 for example process parameters) is used to transfer the pattern down through the antireflective coating 508, hard-mask layer 506, and porous ULK dielectric layer 504, stopping on the etch stop film 502, thus forming via 512 in resultant structure 500C.

As depicted in FIG. 4D the remaining photoresist layer 510 and antireflective coating 508 are removed by conventional plasma or GCIB ashing with mixtures of oxygen and other gases (See Table 2 for example process parameters) to obtain structure 500D. In the preferred approach, the sidewalls of the etched via 512 in the porous ULK dielectric layer 504 are cleaned and densified and rendered non-porous by the GCIB treatment to form a densified sidewall layer 514 (See Table 3 for example process parameters), thus avoiding the need for wet cleaning and avoiding the opportunity for contamination that results from wet processing of porous dielectrics.

Figure 2A:
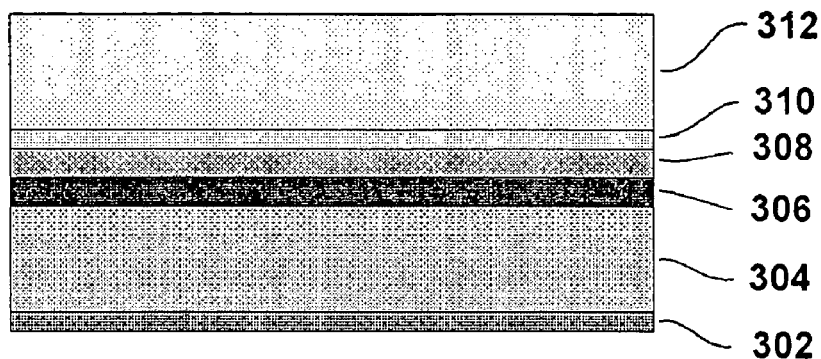
FIGS. 2A-2F show schematics illustrating stages in the prior art conventional "via first" dual damascene ULK integration scheme.
Figure 2B:
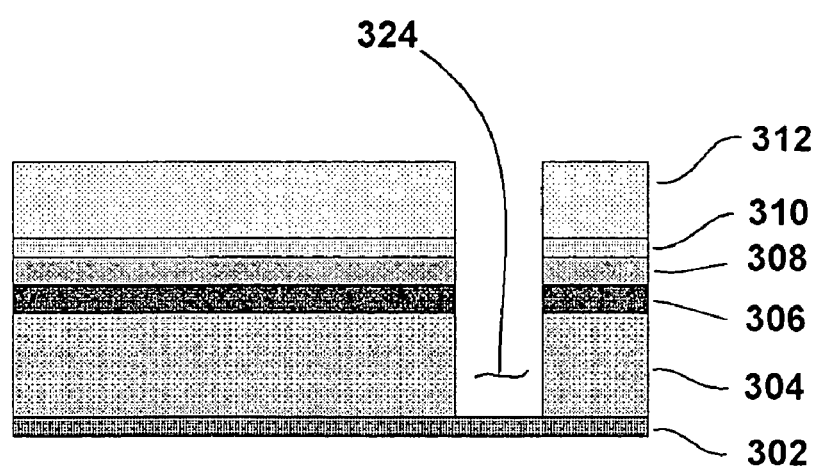
Figure 2C:
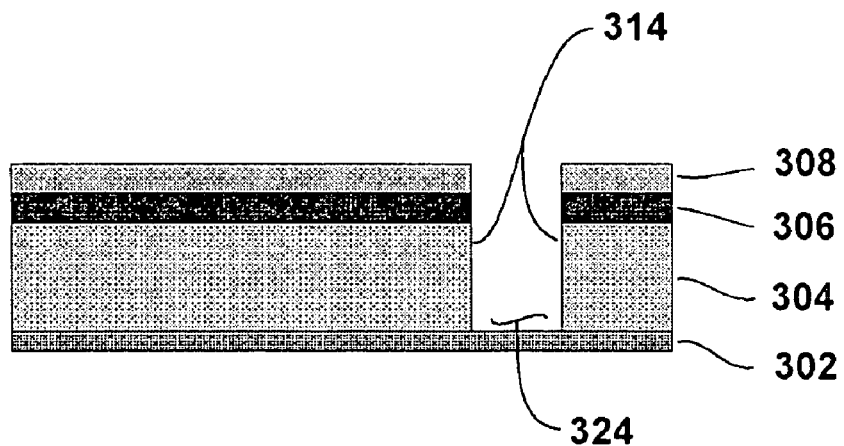
Figure 2D:
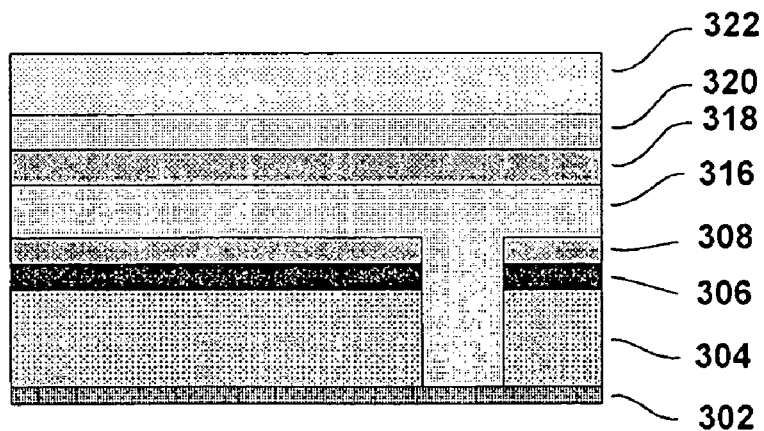
Figure 2E:
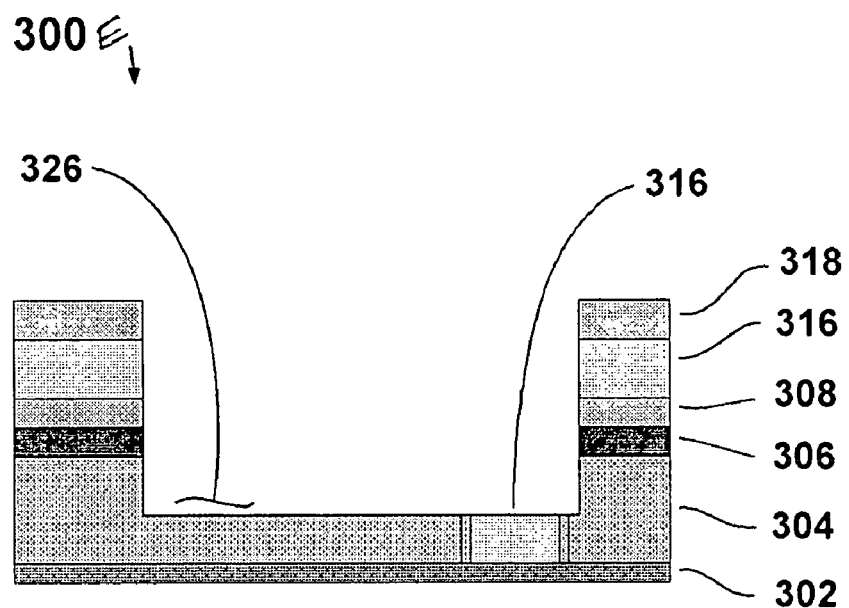
Figure 2F:
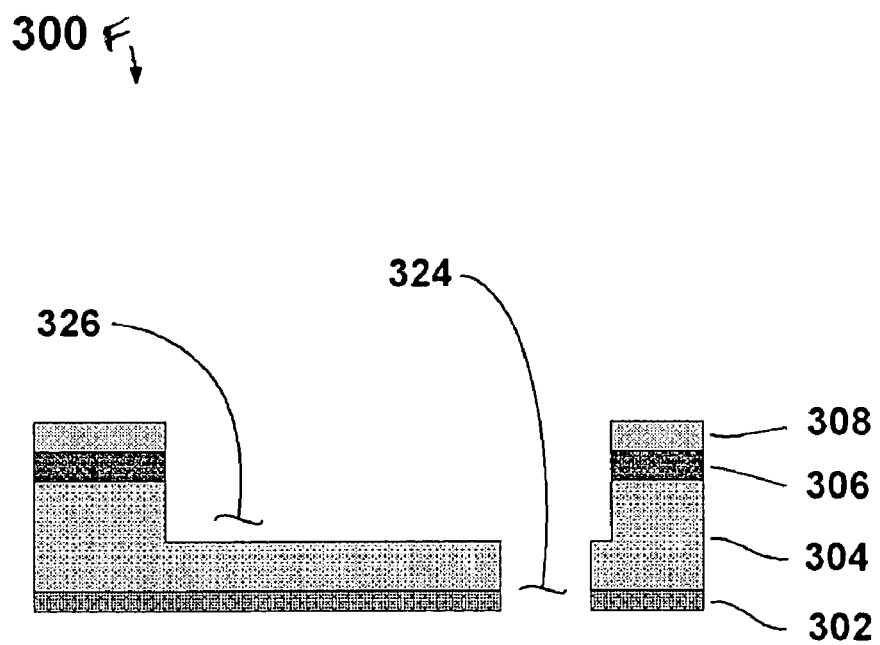

According to FIG. 4E, another masking material layer, comprised of optional bottom antireflective coating 516 and photoresist layer 518 are next applied to the patterned wafer (structure 500E) as shown. Preferably the antireflective coating component of the masking material layer fills the etched vias (via 512 for example) and planarizes the surface prior to the application of photoresist. The bottom antireflective coating 516 and the photoresist layer 518 may similarly be composed of the materials described above. Not including the via filling depth, the bottom antireflective coating 516 material may be (for example) about 200 nm thick. The photoresist layer 518 may be (for example) about 200 nm thick. This structure is significantly simpler than that of the prior art FIG. 2D and represents an improvement since, in the preferred approach, GCIB ash removal of the photoresist and antireflective coating can be used if photo rework capability is desired.

FIG. 4F shows a structure 500F resulting from imaging the resist in the desired trench pattern and then RIE or GCIB etch transferring the pattern down through the bottom antireflective coating 516, hard-mask layer 506, and partially into the porous ULK dielectric layer 504, thus forming a trench 520. The bottom antireflective coat 516 material should have a slightly faster GCIB etch rate than the porous ULK dielectric layer 504 material to avoid un-etched protrusions, "fences", remaining around the upper surface of the via 512 periphery. (See Table 1 for example process parameters—note that the relative etch rates in the bottom antireflective coat 516 and in the porous ULK dielectric layer 504 is controlled by setting the ratio of $NF_3$ to $O_2$ in the gas mixture) As shown in FIG. 4G, an ashing process, preferably a GCIB ashing process (See Table 3 for example process parameters) then removes any remaining photoresist layer 518 and bottom antireflective coating 516 from the surface of the workpiece 500G. This is followed by RIE or GCIB etching to remove the hard-mask layer 506 and to open up the underlying etch stop film 502 to complete the via 512 (See Table 1 for example process parameters.)

As shown in FIG. 4H, a final GCIB treatment (See Table 3 for example process parameters) is then used to complete the densification and smoothing of all the exposed ULK dielectric layer surfaces 522 to obtain the first embodiment of the improved dual damascence structure 500H.

FIGS. 5A-5G illustrate in-process structures 600A-600F and a final dual damascene integration structure 600G using porous ULK dielectrics, formed in accordance with a second embodiment of the present invention, and which is based on initial transfer of a trench pattern into a hard-mask.

Figure 5A:
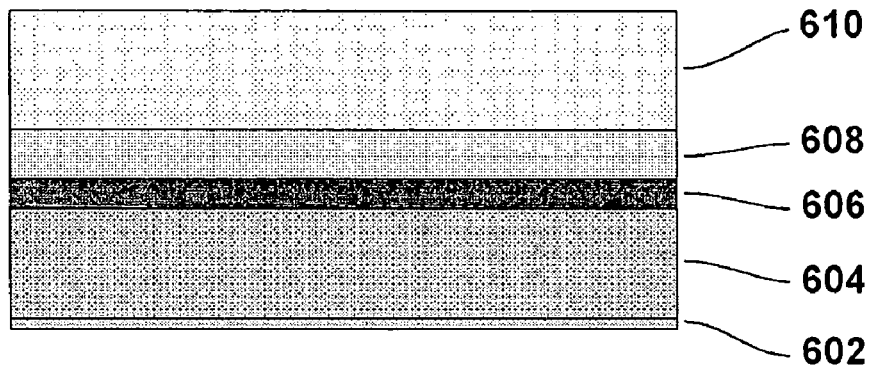
FIGS. 5A-5G show schematics illustrating an integration structure for a second embodiment of the invention and for explaining a second method of the invention.

As shown in FIG. 5A, the process of the second embodiment begins with deposition of a sequence of insulator films over the previous metal wiring level. This insulator stack 600A is comprised of an etch stop film 602, a porous ULK dielectric layer 604 and a hard-mask layer 606. A masking material layer comprised of an optional antireflective coating 608 and photoresist layer 610 are then applied to this insulator stack as also illustrated in this figure. The etch stop material has the same requirements as previously stated for the prior art processes and therefore is typically a material such as $Si_3N_4$ or SiCN. The etch stop film 602 may have a thickness (for example) of about 35 nm. The porous ULK dielectric layer 604 may have a thickness (for example) of about 300 nm. The hard-mask layer 606 in this integration scheme does not remain as part of the dual damascene structure after processing. Therefore, relatively higher-k materials such as $SiO_2$ or $Si_3N_4$ may be used for hard-mask layer 606 compared to what would be required in a conventional integration scheme. Since $SiO_2$ or $Si_3N_4$ are also oxidation resistant, photo rework is allowed. The hard-mask layer 606 may have a thickness (for example) of about 80 nm. This thickness is adjustable depending on the relative etch rates of the hard-mask to the ULK and underlying etch stop. In addition to $SiO_2$ and $Si_3N_4$, other suitable hard mask materials include, but are not necessarily limited to, SiCOH, SiCN and SiC. The antireflective coating 608 may be (for example) about 40 nm thick and the photoresist layer 610 may be (for example) about 200 nm thick. The antireflective coating 608 and the photoresist layer 610 may similarly comprise (for example, not for limitation) the materials discussed above or other known materials. Note that, optionally, prior to formation of the hard-mask layer 606, the surface of the porous ULK dielectric layer 604 may be densified and pore-sealed by gas cluster ion beam processing (see Table 3 for typical process parameters).

Figure 5B:
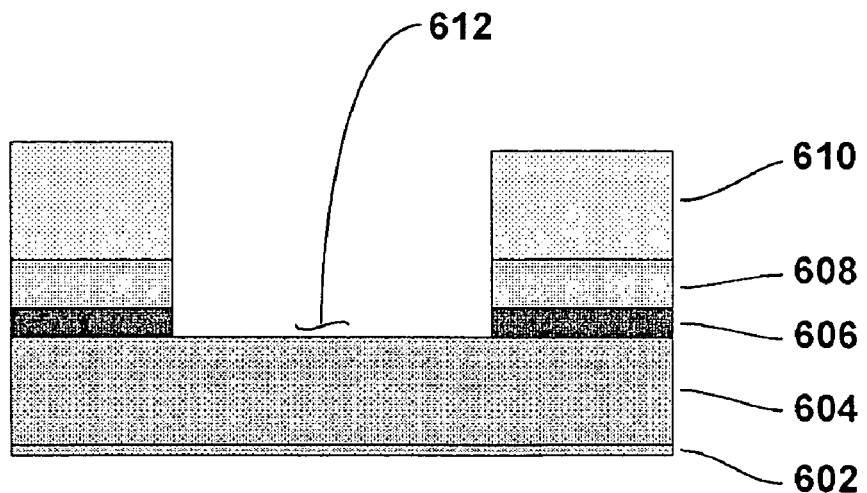

FIG. 5B illustrates resultant structure 600B subsequent to imaging of the photoresist layer 610 in the desired trench pattern and then use of RIE or GCIB etching (See Table 1 for example process parameters) to transfer of the pattern down through the antireflective coating 608 and hard-mask layer 606, stopping after minimal etching of the porous ULK dielectric layer 604, thus forming a trench pattern 612 in hard-mask layer 606.

Figure 5C:
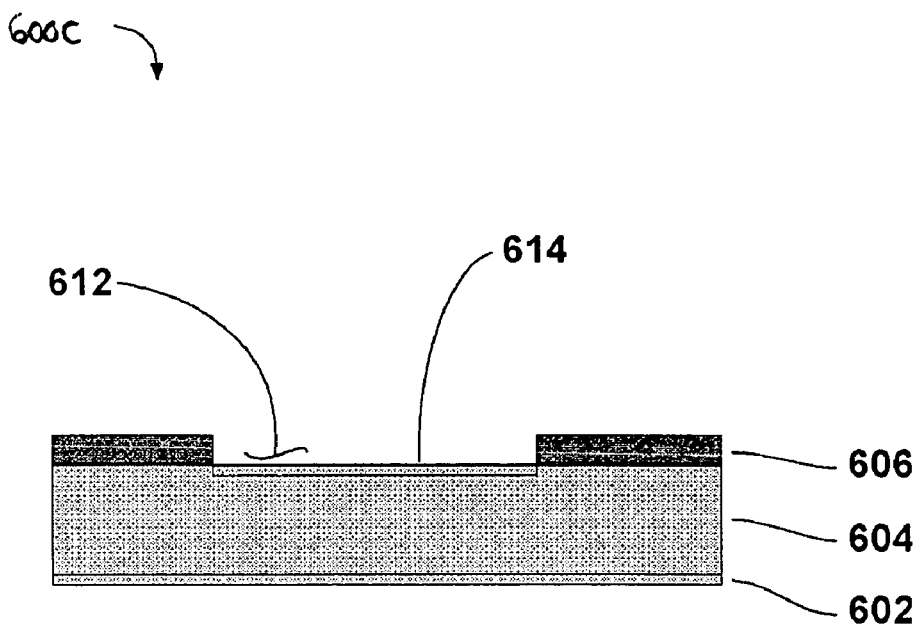

As reflected by structure 600C depicted in FIG. 5C the remaining masking material layer is removed by a conventional plasma or GCIB ashing process with pure concentrations or mixes of oxygen, nitrogen, hydrogen, argon and other gases (See Table 2 for example process parameters) while simultaneously accomplishing densification of surface 614 of the porous ULK dielectric layer 604.

Figure 5D:
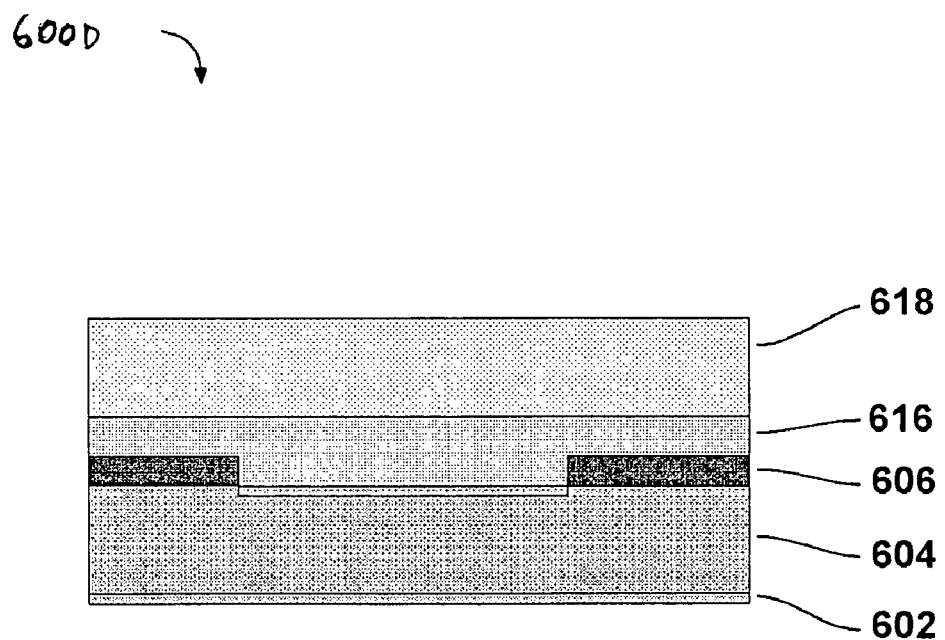

Referring to FIG. 5D, another masking material layer composed of optional antireflective coating 616 and photoresist layer 618 are next applied to the patterned wafer (structure 600D) as shown. The antireflective coating 616 may comprise (for example, not for limitation) "AR 40 Anti-Reflectant" and the photoresist layer 618 may comprise (for example, not for limitation) "Epic™ 2210 ArF Photoresist."

Figure 5E:
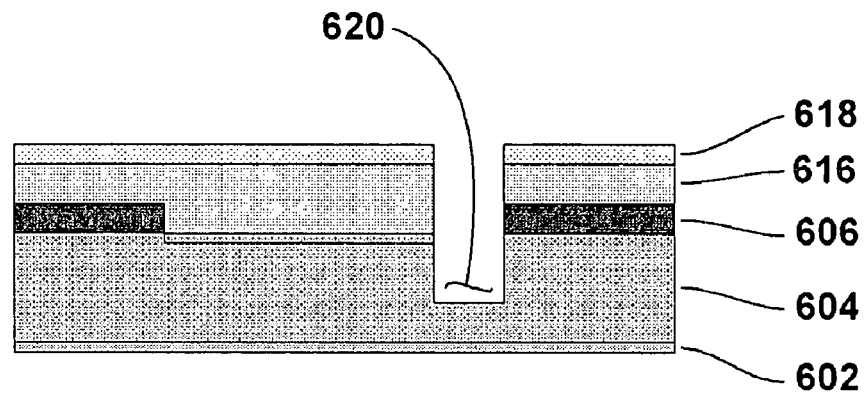

As illustrated in Fig 5E, photoresist layer 618 is imaged in the desired via pattern and RIE or GCIB etching is used to transfer the pattern down through the antireflective coating 616, the hard-mask layer 606, and partially into the porous ULK dielectric layer 604 partially forming via 620. The antireflective coating material should have a similar etch rate to the hard-mask layer 606 during this step (See Table 1 for example process parameters—note that the relative etch rates in the bottom antireflective coat 616 and in the porous ULK dielectric layer 604 is controlled by setting the ratio of $Nf_3$ to $O_2$ in the gas mixture.)

Figure 5F:
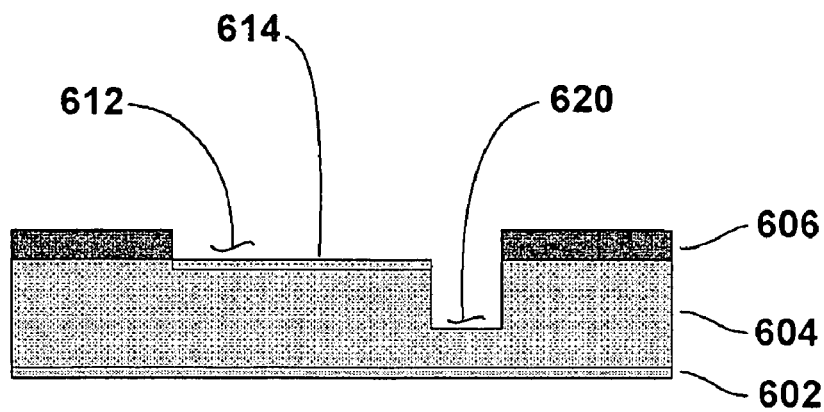

As shown in FIG. 5F, a conventional plasma or preferably GCIB ashing process (See Table 2 for example process parameters) is then used to remove any remaining material of the masking material layer from the workpiece (structure 600F.)

Figure 3A:
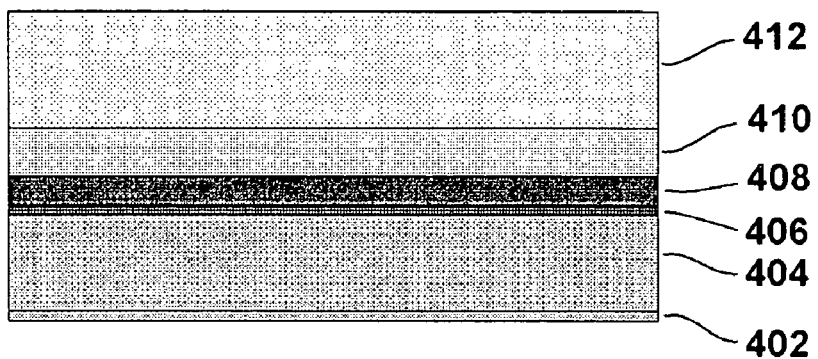
FIGS. 3A-3G show schematics illustrating stages in the prior art conventional "dual hard-mask" dual damascene ULK integration scheme.
Figure 3B:
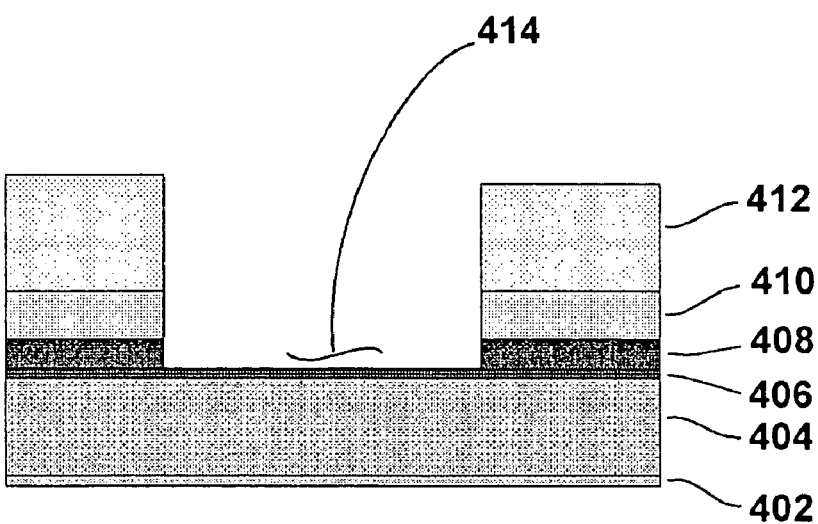
Figure 3C:
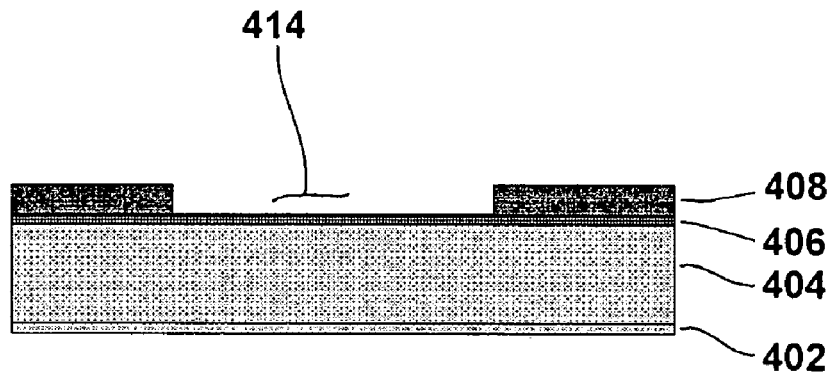
Figure 3D:
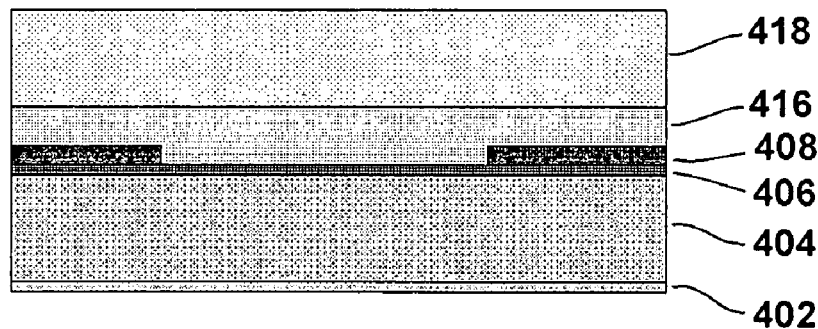
Figure 3E:
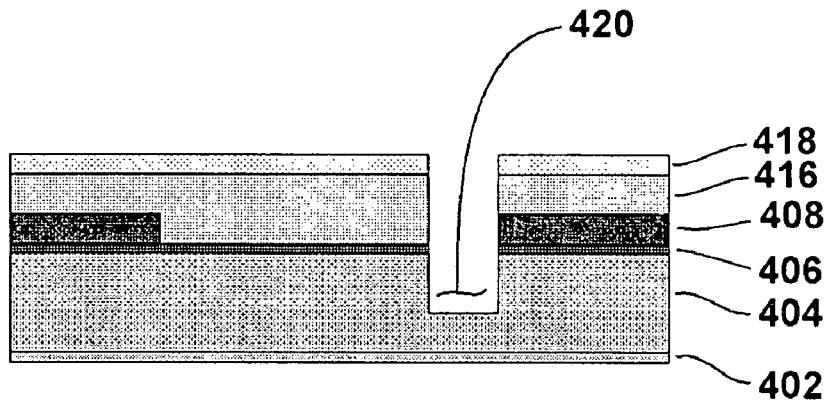
Figure 3F:
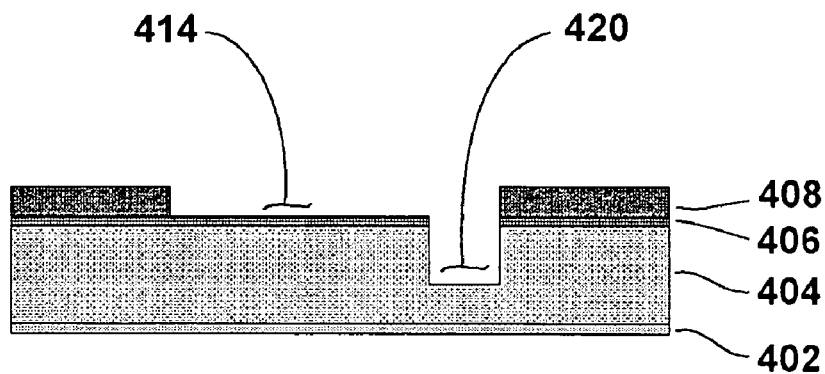
Figure 3G:
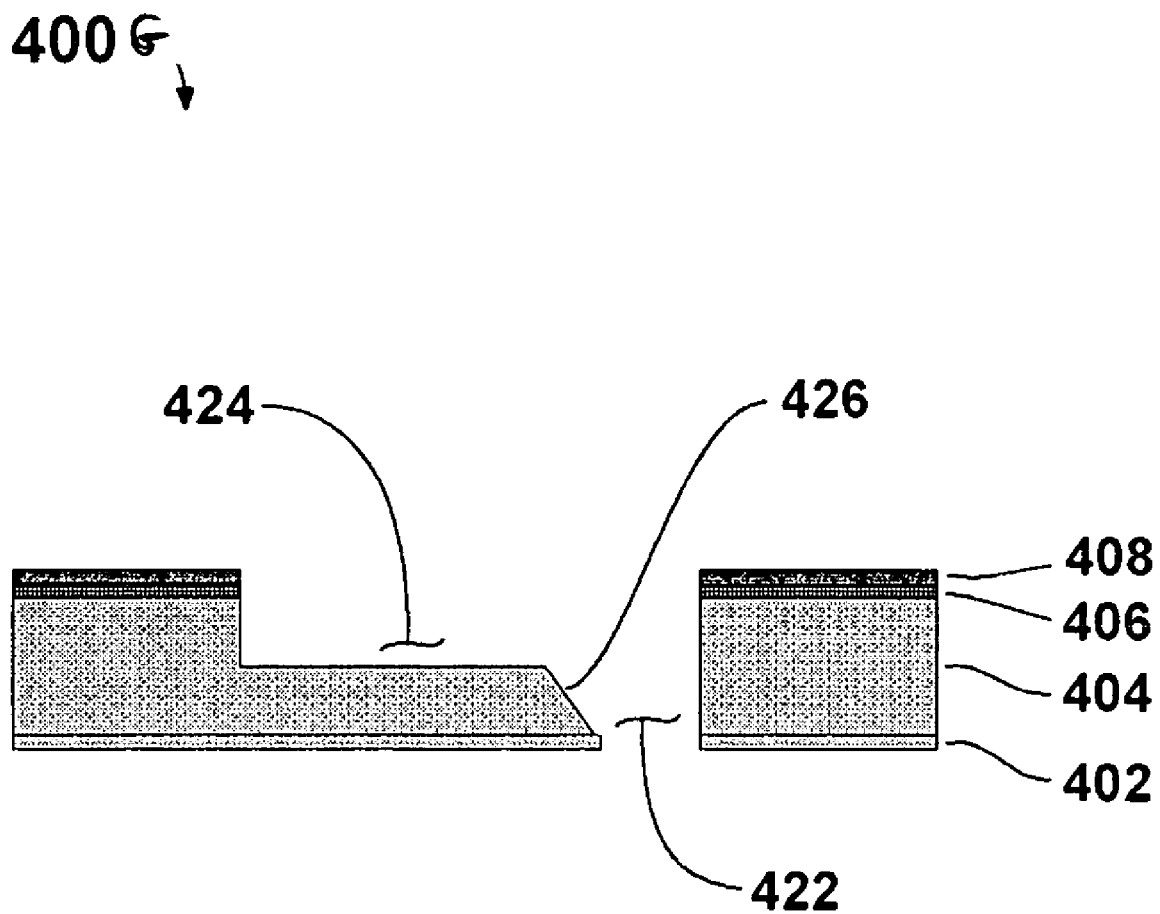
Figure 5G:
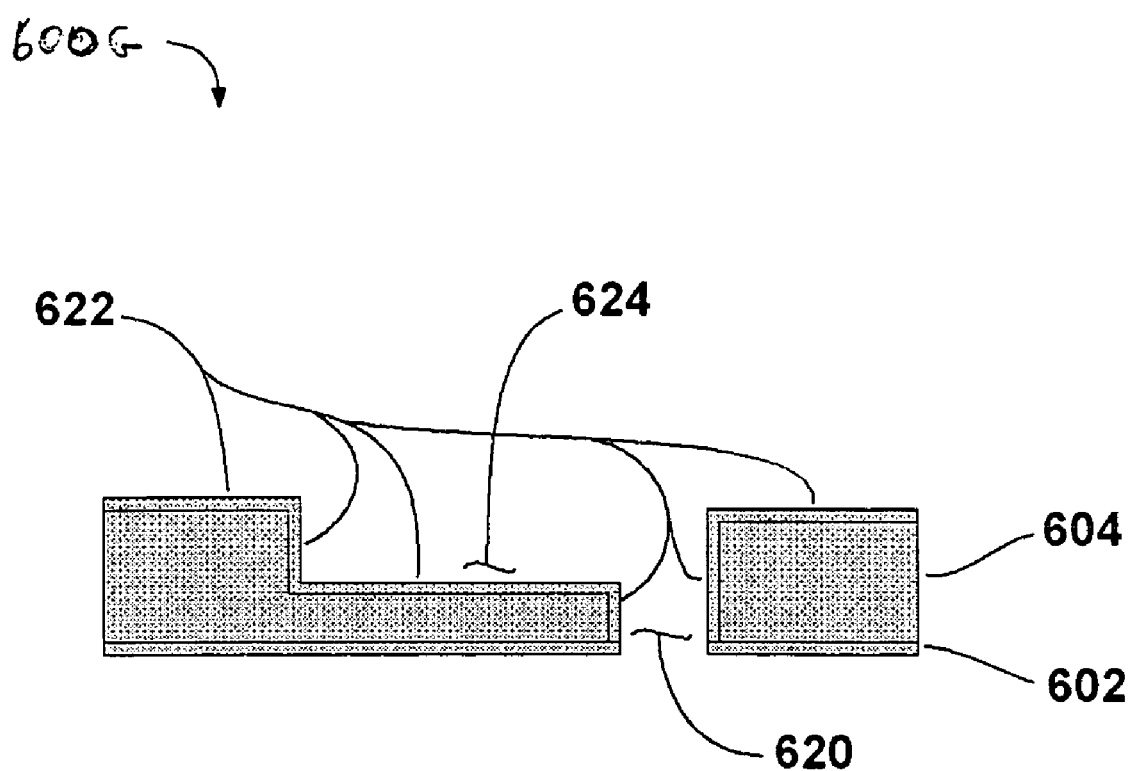

Referring to FIG. 5G, next a RIE or GCIB etch process is utilized which extends the hard-mask layer 606 trench pattern 612 into the porous ULK dielectric layer 604, thus forming trench 624, white simultaneously completing the via etch and opening up the underlying etch stop at the bottom of the via 620, thus completing via 620 (See Table 1 for example process parameters). The hard-mask layer 606 is completely removed during this process. Finally, another GCIB process is used to smooth and densify and to seal pores of all exposed ULK surfaces 622 (See Table 2 for example process parameters). Note that since GCIB etching is highly directional, the sidewalls of the vias do not develop a shallow slope (they have substantially no slope) as in a conventional RIE process (see FIG. 3G for illustration of this problem in the prior art).

Importantly, utilizing GCIB processing eliminates the need for a hard-mask over a porous ULK dielectric material, since the GCIB process can provide smoothing, densification, and pore sealing of the etched ULK dielectric material. RIE removal of the hard-mask over ULK dielectric results in a roughened porous ULK dielectric surface. CMP removal of the hard-mask over ULK dielectric material can provide smoothing but no densification or pore sealing and therefore the associated wet chemistry degrades the porous ULK dielectric material.

Another benefit of this invention is that the number of hard-masks used in the formation of the dual damascene structure is minimized and hard-masks are eliminated in the final etched dual damascene structure. Therefore, the final dual damascene structure has a lower effective k and minimal interfaces that can be sources for leakage, delamination and other reliability problems. The process causes densification and sealing of all porous etched ULK dielectric surfaces such that they are not susceptible to contamination from subsequent processes such CVD or ALD barrier processes. Finally, GCIB etching is not subject to micro-loading effects and therefore provides better control of the etched trench depth and shape such that more precise specification of resistance and capacitance can be made to the design community.

Although the invention has been described with respect to various embodiments, it should be realized this invention is also capable of a wide variety of further and other embodiments within the spirit of the invention.

It is claimed:

1. A method of fabricating a dual damascene integrated structure, comprising the steps of:
    forming a porous ultra-low k dielectric film on an underlying etch stop film;
    forming a hard-mask layer on the porous ultra-low k dielectric film;
    applying a first masking material layer on the hard-mask layer;
    forming a via pattern in the first masking material layer;
    transferring the via pattern in the first masking material layer through the hard-mask layer and through the porous ultra-low k dielectric film to the etch stop film so as to form therein one or more vias with exposed sidewalls;
    forming a first densified layer on the exposed sidewalls of the one or more vias in the porous ultra-low k dielectric film by gas cluster ion beam irradiation;
    removing remnants of the first masking material layer;
    applying a second masking material layer so as to form a layer on the hard-mask layer and to fill the one or more formed vias;
    forming a trench pattern in the second masking material layer;
    transferring the trench pattern in the second masking material layer through the hard-mask layer and at least partially through the porous ultra-low k dielectric film so as to form therein one or more trenches with exposed surfaces and sidewalls;
    removing remnants of the second masking material layer;
    forming a second densified layer on the exposed surfaces and sidewalls of the one or more trenches; and etching the structure by gas cluster ion beam irradiation to open the underlying etch stop layer in the one or more vias and to either partially or completely remove the hard-mask layer.

2. The method of claim 1, wherein the transferring steps are accomplished using reactive ion etching.

3. The method of claim 1, wherein the etch stop film is composed of $Si_3N_4$ or SiCN.

4. The method of claim 1, wherein the hard-mask layer material is chosen from the group consisting of SiCOH, SiC, SiCN, $Si_3N_4$, and $SiO_2$.

5. The method of claim 1, wherein one or more of the removing remnants steps is accomplished using gas cluster ion beam irradiation.

6. The method of claim 1, wherein one or more of the removing remnants steps utilizes a gas cluster ion beam having gas cluster ions comprising one or more of the group of gases consisting of $O_2$, $N_2$, He, and $H_2$.

7. The method of claim 1, wherein the step of transferring the via pattern is accomplished simultaneously with the forming a densified layer step through use of the same gas cluster ion beam irradiation.

8. The method of claim 1, wherein the step of forming the second densified layer is performed on exposed areas including the first densified layer.

9. The method of claim 1, wherein the transferring steps are accomplished using gas cluster ion beam irradiation etching.

10. The method of claim 9, wherein at least one of the transferring steps utilizes a gas cluster ion beam having gas cluster ions comprising a mixture of $O_2$ and a fluorine containing gas.

11. The method of claim 1, further comprising the step of densifying the surface of the porous ultra-low k dielectric film by gas cluster ion beam irradiation prior to the forming a hard-mask layer step.

12. The method of claim 11, wherein the gas cluster ion beam utilized in densifying the surface is comprised of gas cluster ions comprising one or more gases selected from the group consisting of $O_2$, Ar, $N_2$, $CH_4$ and mixtures of $CH_4$ with Ar.

13. The method of claim 1, wherein the first and second masking material layers are each comprised of a photoresist layer.

14. The method of claim 13, wherein at least one of the first masking material layer or the second masking material layer further comprises an antireflective coating material layer.

15. The method of claim 1, wherein the densified layers in the porous ultra-low k dielectric film have substantially sealed pores.

16. The method of claim 15, wherein at least one of the steps of forming a first densified layer and forming a second densified layer utilizes a gas cluster ion beam comprising $O_2$.

17. A damascene integration structure as made by the process of claim 1 with GCIB processing of the ultra-low k dielectric film.

18. A method of fabricating a dual damascene integrated structure, comprising the steps of:
  forming a porous ultra-low k dielectric film on an underlying etch stop film;
  forming a hard-mask layer on the porous ultra-low k dielectric film;
  applying a first masking material layer on the hard-mask layer;
  forming a trench pattern in the first masking material layer;
  transferring the trench pattern in the first masking material layer through the hard-mask layer and minimally into the porous ultra-low k dielectric film so as to form therein one or more trench openings with exposed porous ultra-low k dielectric surfaces;
  forming a first densified layer on the exposed porous ultra-low k dielectric surfaces of the one or more trench openings by gas cluster ion beam irradiation;
  removing remnants of the first masking material layer;
  applying a second masking material layer on the hard-mask layer and the one or more trench openings;
  forming a via pattern in the second masking material layer;
  transferring the via pattern in the second masking material layer at least partially through the porous ultra-low k dielectric film so as to form therein one or more via openings;
  removing remnants of the second masking material layer;
  etching the structure so as to deepen the one or more trench openings to complete one or more trenches having exposed surfaces and sidewalls, to deepen the one or more via openings to complete one or more vias having exposed sidewalls, and to open the underlying etch stop layer in the one or more vias;
  removing the hard-mask layer; and
  forming a second densified layer on all exposed porous ultra-low k dielectric film surfaces and sidewalls by gas cluster ion beam processing.

19. The method of claim 18, wherein either step of transferring is accomplished using reactive ion etching.

20. The method of claim 18, wherein either step of transferring is accomplished using gas cluster ion beam irradiation.

21. The method of claim 18, wherein the transferring the via pattern step utilizes a gas cluster ion beam having gas cluster ions comprising a mixture of $O_2$ and a fluorine containing gas.

22. The method of claim 18, wherein the etch stop film comprises $Si_3N_4$ or SiCN.

23. The method of claim 18, wherein the hard-mask layer is chosen from the group consisting of SiCOH, SiC, SiCN, $Si_3N_4$, and $SiO_2$.

24. The method of claim 18, wherein the step of forming the second densified layer is performed on exposed areas including the first densified layer.

25. The method of claim 18, further comprising the step of densifying the surface of the porous ultra-low k dielectric film by gas cluster ion beam irradiation prior to the forming a hard-mask layer step.

26. The method of claim 25, wherein the gas cluster ion beam utilized in densifying the surface is comprised of gas cluster ions comprising one or more gases selected from the group consisting of $O_2$, Ar, $N_2$, $CH_4$ and mixtures of $CH_4$ with Ar.

27. The method of claim 18, wherein one or more of the removing remnants steps is done by gas cluster ion beam irradiation.

28. The method of claim 27 wherein at least one of the one or more removing remnants steps utilizes a gas cluster ion beam having gas cluster ions comprising one or more of the group of gases consisting of $O_2$, $N_2$, He, and $H_2$.

29. The method of claim 18, wherein the step of transferring the trench pattern is accomplished simultaneously with the forming of a densified layer step through use of the same gas cluster ion beam irradiation.

30. The method of claim 29, wherein at least one of the steps of forming a first densified layer and forming a second densified layer utilizes a gas cluster ion beam comprising $O_2$.

31. The method of claim 18, where in the first and second masking material layers each comprise a photoresist layer.

32. The method of claim 31, wherein at least one of the first or the second masking material layer further comprises an antireflective coating material layer.

33. A damascene integration structure as made by the process of claim 18 with GCIB processing of the ultra-low k dielectric material.

34. A method, comprising the steps of:
forming a porous ultra-low k dielectric material layer; and
etching at least a portion of said porous ultra-low k dielectric material layer by exposing said portion to a gas cluster ion beam,
wherein said etching forms at least one trench or via in said porous ultra-low k dielectric material layer having a sidewall with substantially no slope, and
densifying a layer of the porous ultra-low k dielectric material on the sidewall using a gas cluster ion beam on the sidewall.

35. A method, comprising the steps of:
forming a porous ultra-low k dielectric material layer; and
etching at least a portion of said porous ultra-low k dielectric material layer by exposing said portion to a gas cluster ion beam,
wherein the gas cluster ion beam comprises a mixture of a fluorine containing gas in the range of 1% to 10% by molecule or mole percent and $O_2$ in the range of 90% to 99% by molecule or mole percent.

36. The method of claim 35, wherein the gas cluster ion beam comprises $NF_3$ in the range of 1% to 5% by molecule or mole percent and $O_2$ in the range of 95% to 99% by molecule or mole percent.

37. A method of fabricating an integrated semiconductor structure, comprising the steps of:
forming a porous ultra-low k dielectric film on an underlying etch stop film;
forming a hard-mask layer on the porous ultra-low k dielectric film;
applying a masking material layer on the hard-mask layer;
forming a via or trench pattern in the masking material layer;
transferring the via or trench pattern in the masking material layer through the hard-mask layer and through at least a portion of the porous ultra-low k dielectric film using gas cluster ion beam irradiation etching,
wherein the gas cluster ion beam comprises a mixture of a fluorine containing gas in the range of 1% to 10% by molecule or mole percent and $O_2$ in the range of 90% to 99% by molecule or mole percent.

* * * * *